(12) United States Patent
Todaka et al.

(10) Patent No.: US 12,426,220 B2
(45) Date of Patent: Sep. 23, 2025

(54) WATER JACKET

(71) Applicant: HONDA MOTOR CO., LTD., Tokyo (JP)

(72) Inventors: Hirosumi Todaka, Saitama (JP); Yasunari Kimura, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 259 days.

(21) Appl. No.: 18/128,769

(22) Filed: Mar. 30, 2023

(65) Prior Publication Data

US 2023/0320042 A1 Oct. 5, 2023

(30) Foreign Application Priority Data

Mar. 31, 2022 (JP) ................. 2022-059085

(51) Int. Cl.
*H05K 7/20* (2006.01)
*B33Y 80/00* (2015.01)

(52) U.S. Cl.
CPC .......... *H05K 7/20927* (2013.01); *B33Y 80/00* (2014.12)

(58) Field of Classification Search
CPC .......................... H05K 7/20927; H01L 23/473
See application file for complete search history.

(56) References Cited

U.S. PATENT DOCUMENTS

| | | | |
|---|---|---|---|
| 10,757,842 B2 * | 8/2020 | Takeuchi | H05K 1/0203 |
| 2005/0133210 A1 | 6/2005 | Inagaki et al. | |
| 2007/0163765 A1 | 7/2007 | Rondier et al. | |
| 2009/0008061 A1 | 1/2009 | Inagaki et al. | |
| 2018/0098459 A1 * | 4/2018 | Chainer | H05K 7/20272 |
| 2018/0332739 A1 | 11/2018 | Takeuchi | |
| 2020/0003497 A1 | 1/2020 | Aston et al. | |
| 2021/0247140 A1 | 8/2021 | Aston et al. | |

FOREIGN PATENT DOCUMENTS

| | | | | |
|---|---|---|---|---|
| JP | 2005-228877 A | 8/2005 | | |
| JP | 2007-510299 A | 4/2007 | | |
| JP | 5184218 B2 | 4/2013 | | |
| JP | 2015-053362 A | 3/2015 | | |
| JP | 2018-190901 A | 11/2018 | | |
| JP | 2020-025087 A | 2/2020 | | |
| WO | WO-2005043621 A1 * | 5/2005 | ........... | H01L 23/473 |

OTHER PUBLICATIONS

WO 2005043621 A1 English translation (Year: 2005).*
Jul. 1, 2025, translation of Japanese Office Action issued for related JP Application No. 2022-059085.

* cited by examiner

*Primary Examiner* — Mukundbhai G Patel
(74) *Attorney, Agent, or Firm* — Paratus Law Group, PLLC

(57) ABSTRACT

A water jacket for cooling a plate-shaped heat generating component includes a base having a thin plate shape. The base includes: a refrigerant inflow portion configured to allow a refrigerant to flow thereinto; a refrigerant flow path that communicates with the refrigerant inflow portion and is branched inside the base; and a refrigerant outflow portion that communicates with the refrigerant flow path and is configured to allow the refrigerant to flow out therefrom.

7 Claims, 5 Drawing Sheets

WATER JACKET

CROSS-REFERENCE TO RELATED APPLICATIONS

This application is based on and claims priority under 35 USC 119 from Japanese Patent Application No. 2022-059085 filed on Mar. 31, 2022, the entire content of which is incorporated herein by reference

TECHNICAL FIELD

The present invention relates to a water jacket.

BACKGROUND ART

In the related art, research and development have been conducted to contribute to improvement in energy efficiency in order to allow more people to access reliable, sustainable and advanced energy.

For example, research and development related to electrification have been performed also in transportation equipment such as vehicles and manned drones. When the transportation equipment and the like are electrically driven, in addition to a power storage device such as a battery and a capacitor, and a rotary electric machine such as a motor and a generator, an inverter that converts DC power stored in the battery into AC power and supplies the AC power to the motor is required. Since the inverter is a heat generating component, the inverter is generally cooled by a water jacket.

For example, in an inverter unit of JP5184218B, an opening portion of a unit case and a peripheral edge of a water jacket are brought into contact with each other with a base frame interposed therebetween, and both are fixed by bolts. Further, a refrigerant flow path of the water jacket is formed by covering a recessed groove formed on an upper surface of the water jacket with a resin portion of the base frame.

However, in the inverter unit described in JP5184218B, since the refrigerant flow path of the water jacket is formed by covering the recessed groove formed on the upper surface of the water jacket with the resin portion of the base frame, leakage of the refrigerant may occur due to vibration, posture change, impact, or the like due to an external force. In addition, in order to improve the energy efficiency, it is also required to make the water jacket compact.

An aspect of the present disclosure relates to provide a water jacket that can prevent leakage of a refrigerant even when an external force is applied, and that can be made compact and have high quality. Further, this contributes to efficiency of energy.

SUMMARY OF INVENTION

According to an aspect of the present disclosure, there is provided a water jacket for cooling a plate-shaped heat generating component, the water jacket including a base having a thin plate shape. The base includes: a refrigerant inflow portion configured to allow a refrigerant to flow thereinto; a refrigerant flow path that communicates with the refrigerant inflow portion and is branched inside the base; and a refrigerant outflow portion that communicates with the refrigerant flow path and is configured to allow the refrigerant to flow out therefrom.

DESCRIPTION OF EMBODIMENTS

Hereinafter, an embodiment of the present invention will be described with reference to FIGS. 1 to 5.

Power Control Unit

Figure 1:
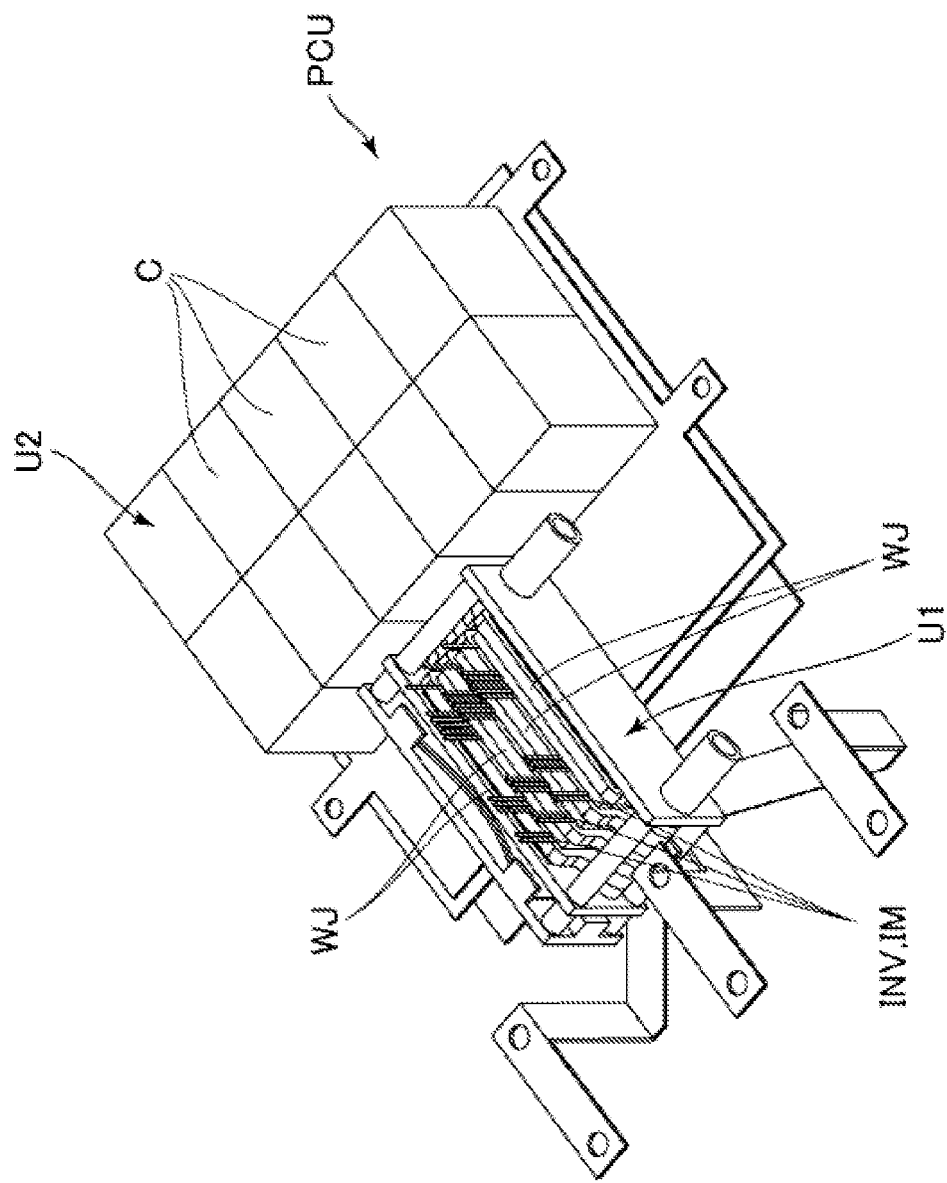
FIG. 1 is a perspective view of a power control unit PCU including a water jacket WJ.

As shown in FIG. 1, a water jacket WJ according to an embodiment of the present invention is provided, for example, in a power control unit PCU for transportation equipment. The power control unit PCU includes a power storage unit U2 and an inverter INV that converts electric power of the power storage unit U2 to drive a motor MOT (see FIG. 2). The inverter INV is configured with a plurality of (three in the present embodiment) inverter modules IM, and the water jacket WJ cools the plurality of inverter modules IM by configuring an inverter unit U1 together with the plurality of inverter modules IM.

The power storage unit U2 is configured by, for example, connecting a plurality of electric double layer capacitors C (hereinafter referred to as capacitors C) in series. The power storage unit U2 mainly supplies electric power to the motor MOT. The power storage unit U2 is configured to be chargeable with electric power supplied at the time of regeneration. The power storage device is not limited to a capacitor unit in which a plurality of electric double layer capacitors are connected in series, and may be a battery unit in which a plurality of power storage cells such as a lithium ion battery and a nickel hydrogen battery are stacked. Hereinafter, the inverter INV, the inverter module IM, and the water jacket WJ will be sequentially described.

Inverter

Figure 2:
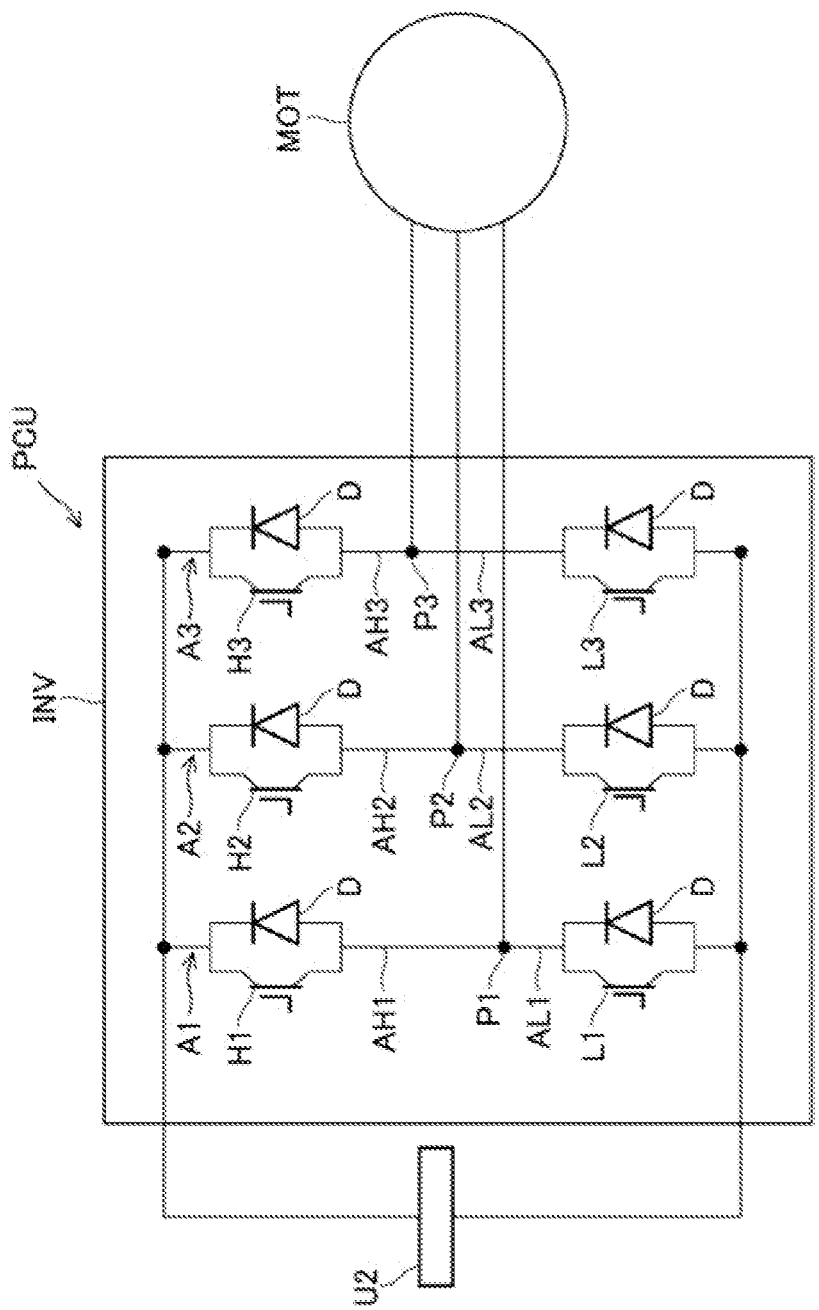
FIG. 2 is a diagram showing a configuration of an inverter INV disposed between a power storage unit U2 and a motor MOT.

As shown in FIG. 2, the inverter INV has a plurality of switching elements H1 to H3 and L1 to L3, and drives the motor MOT by switching control of the plurality of switching elements H1 to H3 and L1 to L3. Specifically, the inverter INV converts DC power output from the power storage unit U2 into AC power, and outputs the converted AC power to the motor MOT. The inverter INV converts AC power output from the motor MOT into DC power, and outputs the converted DC power to the power storage unit U2. The switching element is, for example, an insulated gate bipolar transistor (IGBT), a metal oxide semiconductor (MOS) transistor for electric power, a bipolar transistor for electric power, or the like.

More specifically, the inverter INV includes first to third arms A1 to A3 connected in parallel to the power storage unit U2. The first arm A1 includes an upper arm AH1 in which the switching element H1 and a freewheel diode D are provided in parallel, and a lower arm AL1 in which the switching element L1 and the freewheel diode D are provided in parallel and that is connected in series to the upper arm AH1 via a midpoint P1. The second arm A2 includes an upper arm AH2 in which the switching element H2 and the freewheel diode D are provided in parallel, and a lower arm AL2 in which the switching element L2 and the freewheel diode D are provided in parallel and that is connected in series to the upper arm AH2 via a midpoint P2. The third arm A3 includes an upper arm AH3 in which the switching element H3 and the freewheel diode D are provided in parallel, and a lower arm AL3 in which the switching element L3 and the freewheel diode D are provided in parallel and that is connected in series to the upper arm AH3 via a midpoint P3. The midpoints P1 to P3 of the first to third arms A1 to A3 are connected to the three-phase coils of the motor MOT.

Inverter Module

Figure 3:
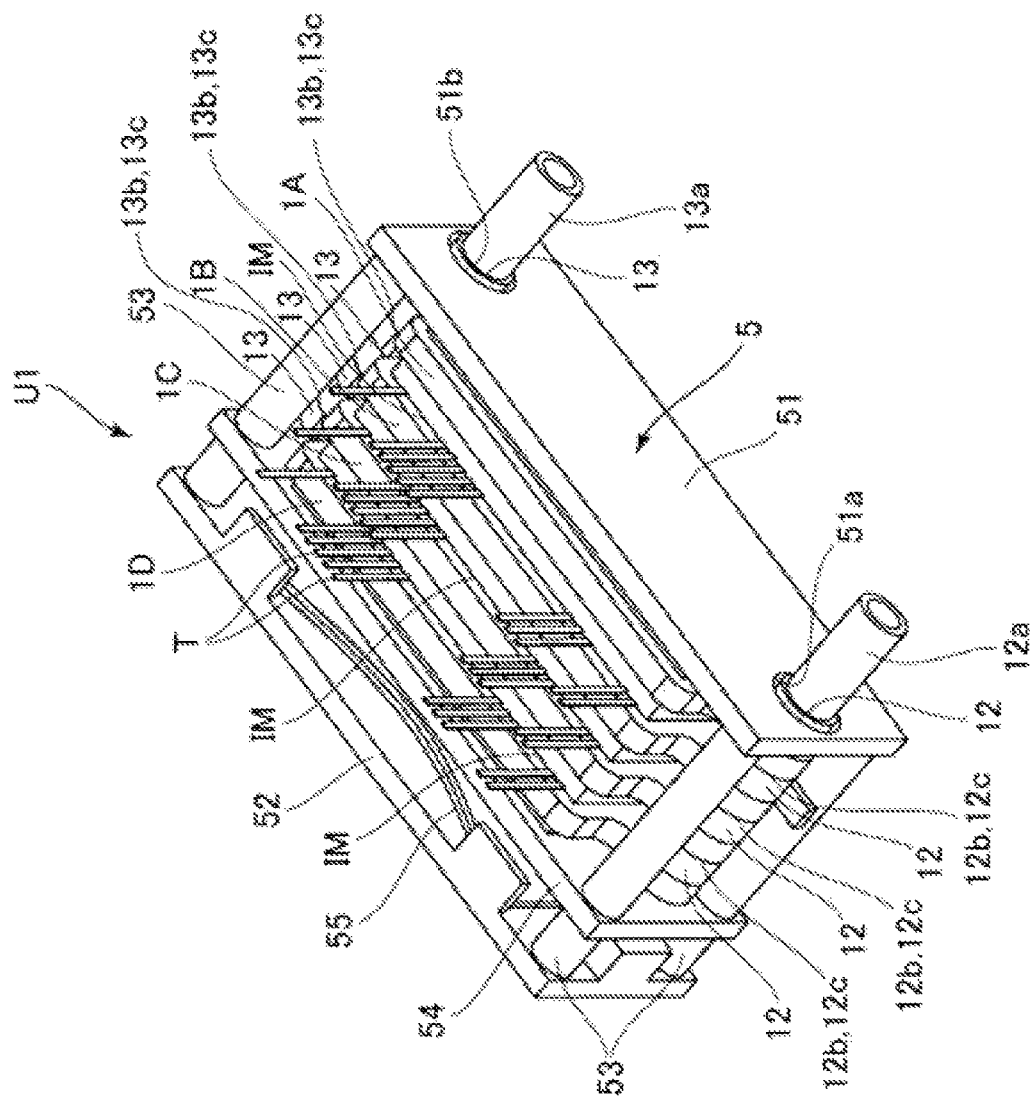
FIG. 3 is a perspective view showing an inverter unit U1 in which the water jacket WJ is incorporated.
Figure 4:
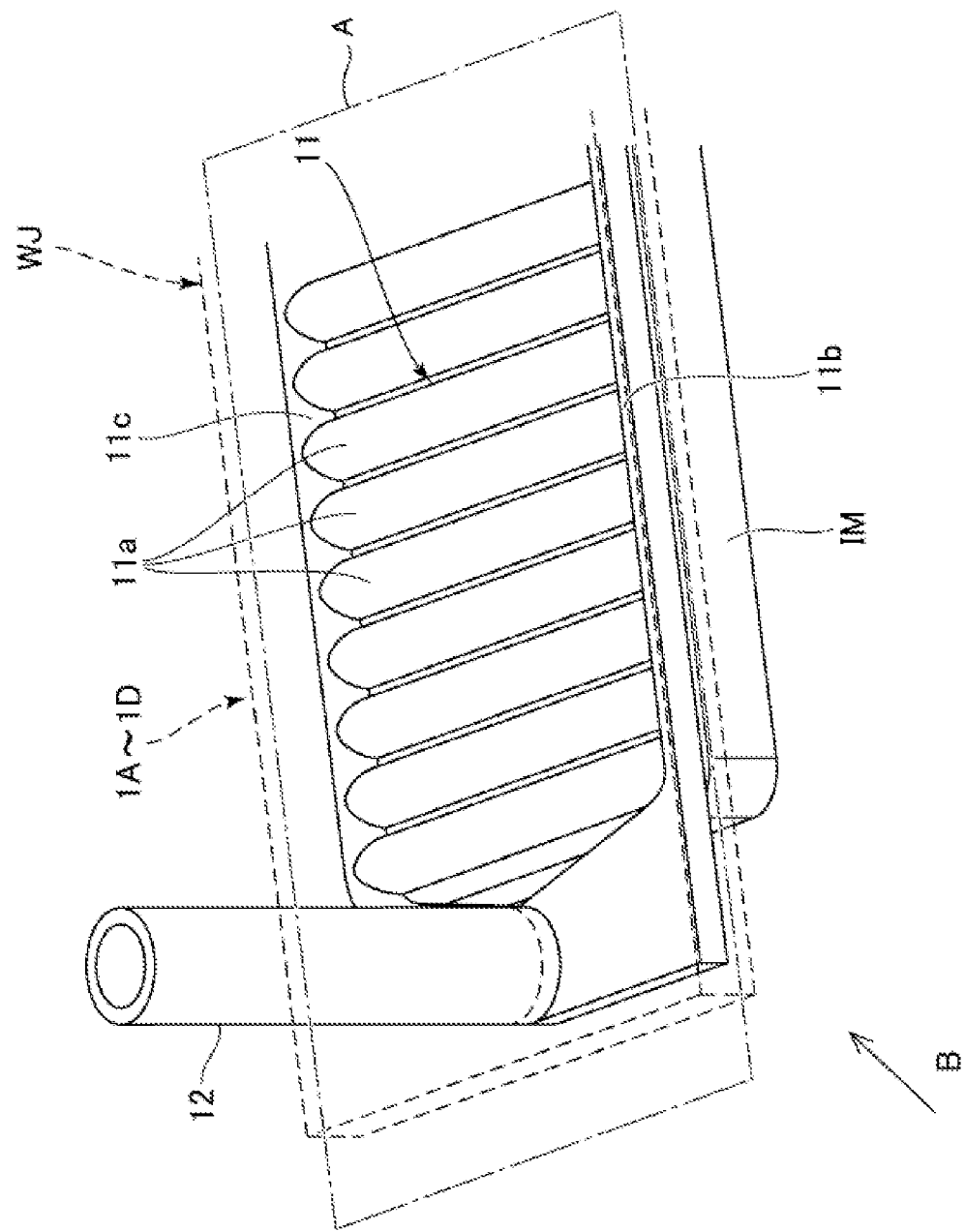
FIG. 4 is a perspective view of a main portion showing a flow of a refrigerant in bases 1A to 1D.
Figure 5:
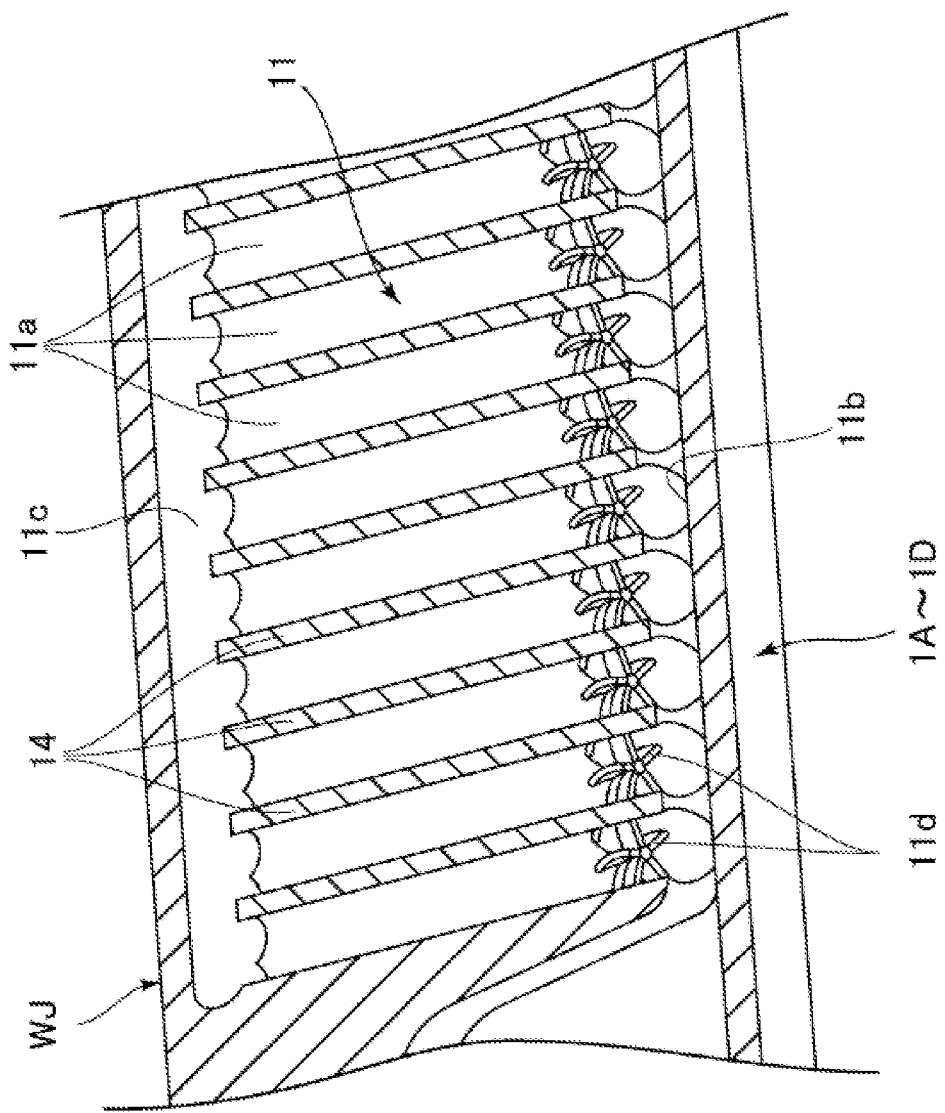
FIG. 5 is a sectional perspective view of a section A in FIG. 4 as viewed from a direction of an arrow B.

Three inverter modules IM are used, for example, for a U-phase constituting the first arm A1, for a V-phase constituting the second arm A2, and for a W-phase constituting the third arm A3. Each inverter module IM is a heat generating component having a rectangular thin plate shape. Each of the inverter modules IM has a plurality of terminals T extending outward from a side surface portion, and these terminals T are connected to each other via a predetermined external wiring (not shown) to form the inverter INV Water Jacket As shown in FIG. 3, the water jacket WJ includes a plurality of bases 1A to 1D. Each of the bases 1A to 1D has a rectangular thin plate shape having substantially the same area as that of the inverter module IM, and as shown in FIGS. 4 and 5, a refrigerant flow path 11 branched in the inside is formed in the inside of each of the bases 1A to 1D.

Returning to FIG. 3, a refrigerant inflow portion 12 into which a refrigerant flows and that communicates with the refrigerant flow path 11 is provided at one end portion of each of the bases 1A to 1D in a longitudinal direction. A refrigerant outflow portion 13 that communicates with the refrigerant flow path 11 and through which the refrigerant flows out is provided at the other end portion of each of the bases 1A to 1D in the longitudinal direction.

The inverter module IM is disposed between the plurality of bases 1A to 1D stacked in a plate thickness direction. For example, in FIG. 3, a first inverter module IM is disposed between the base 1A located on the most front side and the base 1B adjacent to a back side of the base 1A, a second inverter module IM is disposed between the base 1B and the base 1C adjacent to a back side of the base 1B, and a third inverter module IM is disposed between the base 1C and the base 1D adjacent to a back side of the base 1C. According to such a water jacket WJ, since the bases 1A to 1D are provided on both surfaces of the inverter modules IM, the inverter modules IM can be appropriately cooled from both sides.

In the stacked bases 1A to 1D, positions of the refrigerant inflow portions 12 of the bases 1A to 1D are the same on planes orthogonal to a stacking direction, and positions of the refrigerant outflow portions 13 of the bases 1A to 1D are also the same on the planes orthogonal to the stacking direction. According to such a water jacket WJ, since the refrigerant inflow portions 12 of the plurality of bases 1A to 1D are aggregated and the refrigerant outflow portions 13 of the plurality of bases 1A to 1D are aggregated, not only the compactness can be achieved, but also connection and sealing treatment between the refrigerant inflow portions 12 of the plurality of bases 1A to 1D and connection and sealing treatment between the refrigerant outflow portions 13 of the plurality of bases 1A to 1D are facilitated. In addition, even if an external force is applied to the water jacket WJ, a portion where the leakage of the flowing refrigerant may occur is only a connection portion between the refrigerant inflow portions 12 and a connection portion between the refrigerant outflow portions 13, and the leakage of the refrigerant can be prevented by appropriately sealing the connection portion between the refrigerant inflow portions 12 and the connection portion between the refrigerant outflow portions 13. Details of the refrigerant flow path 11, the refrigerant inflow portion 12, and the refrigerant outflow portion 13 will be described later.

The plurality of inverter modules IM and the plurality of bases 1A to 1D alternately stacked are pressurized from both sides in the stacking direction. In other words, the base 1A located on one end side and the base 1D located on the other end side in the stacking direction are pressurized in directions approaching each other. For example, pressurization is performed by using a unit frame 5 as shown in FIG. 3. The unit frame 5 includes a first fixing frame 51, a second fixing frame 52 facing the first fixing frame 51, a plurality of coupling shafts 53 coupling the first fixing frame 51 and the second fixing frame 52, a movable frame 54 facing the first fixing frame 51 and the second fixing frame 52 and movable along the plurality of coupling shafts 53, and a plate spring 55 disposed between the second fixing frame 52 and the movable frame 54 and configured to urge the movable frame 54 toward the first fixing frame 51. According to such a unit frame 5, by disposing the plurality of inverter modules IM and the plurality of bases 1A to 1D alternately stacked between the first fixing frame 51 and the movable frame 54, the base 1A located on the one end side and the base 1D located on the other end side in the stacking direction are pressurized in the directions approaching each other, and therefore the plurality of bases 1A to 1D and the plurality of inverter modules IM are brought into close contact with each other, and the plurality of inverter modules IM can be appropriately cooled.

The plurality of bases 1A to 1D include a starting end base 1A disposed at a starting end in the stacking direction, a terminal end base 1D disposed at a terminal end in the stacking direction, and intermediate bases 1B, 1C disposed between the starting end base 1A and the terminal end base 1D. In the three types of bases 1A to 1D, shapes of the refrigerant flow paths 11 are common, but shapes of the refrigerant inflow portions 12 and the refrigerant outflow portions 13 are different.

The refrigerant inflow portions 12 and the refrigerant outflow portions 13 of the bases 1A to 1D basically have a cylindrical shape communicating with each other in the stacking direction. One end side (front side in FIG. 3) of the refrigerant inflow portion 12 provided at the starting end base 1A is provided with a supply pipe connecting portion 12a extending through a through hole 51a of the first fixing frame 51, and a refrigerant supply pipe (not shown) is connected to the supply pipe connecting portion 12a. One end side of the refrigerant outflow portion 13 provided at the starting end base 1A is provided with a discharge pipe connecting portion 13a extending through a through hole 51b of the first fixing frame 51, and a refrigerant discharge pipe (not shown) is connected to the discharge pipe connecting portion 13a. Further, the other end side (the back side in FIG. 3) of the refrigerant inflow portion 12 and the other end side of the refrigerant outflow portion 13 provided at the starting end base 1A are provided with fitting portions 12b, 13b that are fittable to fitting portions 12c, 13c of the refrigerant inflow portion 12 and the refrigerant outflow portion 13 provided at the adjacent intermediate bases 1B, 1C (or the terminal end base 1D). A fitting form of the fitting portions 12b, 13b and the fitting portions 12c, 13c is, for example, spigot fitting, and sealing treatment is performed therebetween.

The one end side of the refrigerant inflow portion 12 and the one end side of the refrigerant outflow portion 13 provided at the intermediate bases 1B, 1C are provided with the above fitting portions 12c, 13c. In addition, the other end side of the refrigerant inflow portion 12 and the other end side of the refrigerant outflow portion 13 provided at the intermediate bases 1B, 1C are provided with the fitting portions 12b, 13b that are fittable to the fitting portions 12c, 13c of the refrigerant inflow portion 12 and the refrigerant outflow portion 13 provided at the intermediate base 1C adjacent to the intermediate base 1B or the terminal base 1D adjacent to the intermediate base 1C.

The one end side of the refrigerant inflow portion 12 and the one end side of the refrigerant outflow portion 13 provided at the terminal base 1D are provided with the above fitting portions 12c, 13c. The other end side of the refrigerant inflow portion 12 and the other end side of the refrigerant outflow portion 13 provided at the terminal base 1D are sealed by a lid (not shown) which is integrally formed or formed as a separate member. Accordingly, the refrigerant supplied to the refrigerant inflow portion 12 of the starting end base 1A flows into the refrigerant flow paths 11 of the bases 1A to 1D via the refrigerant inflow portions 12 of the bases 1A to 1D, and the refrigerant flowing out of the refrigerant flow paths 11 of the bases 1A to 1D is discharged from the refrigerant outflow portion 13 of the starting end base 1A via the refrigerant outflow portions 13 of the bases 1A to 1D.

As shown in FIGS. 4 and 5, the refrigerant flow path 11 of each of the bases 1A to 1D includes a plurality of refrigerant flow paths 11a arranged in parallel. Note that, in FIG. 4, the water jacket WJ is indicated by a broken line, the refrigerant flowing through the water jacket WJ is indicated by a solid line, and in FIG. 5, the water jacket WJ is indicated by a solid line. According to such bases 1A to 1D, as shown in FIG. 5, since ribs 14 (support walls continuous in the stacking direction) along the refrigerant flow paths 11a are formed between the refrigerant flow paths 11a adjacent to each other and arranged in parallel, deformation of the bases 1A to 1D can be prevented even when an external force is applied to the water jacket WJ.

As shown in FIGS. 4 and 5, each of the bases 1A to 1D includes a refrigerant supply path 11b communicating with the refrigerant inflow portion 12 and a refrigerant discharge path 11c communicating with the refrigerant outflow portion 13. The refrigerant supply path 11b is formed along the longitudinal direction of the bases 1A to 1D and at one end side in a transverse direction of the bases 1A to 1D, and the refrigerant discharge path 11c is formed along the longitudinal direction of the bases 1A to 1D and at the other end side in the transverse direction of the bases 1A to 1D. The plurality of refrigerant flow paths 11a are formed so as to extend along the transverse direction of the bases 1A to 1D between the refrigerant supply path 11b and the refrigerant discharge path 11c and to be arranged in parallel at predetermined intervals in the longitudinal direction of the bases 1A to 1D, and communicate with both the refrigerant supply path 11b and the refrigerant discharge path 11c. According to such bases 1A to 1D, it is possible to prevent a temperature gradient or a variation in temperature as compared with a case where the refrigerant flow paths 11a are connected in series. That is, since the refrigerant flowing into each of the bases 1A to 1D flows through the refrigerant supply path 11b along the longitudinal direction of the bases 1A to 1D and then flows into the plurality of refrigerant flow paths 11a along the transverse direction of the bases 1A to 1D, it is possible to appropriately prevent the temperature gradient or the variation in temperature that is likely to occur in the longitudinal direction of the bases 1A to 1D (the inverter module IM).

In addition, as shown in FIG. 5, a turbulent flow generation portion 11d may be formed in the refrigerant flow path 11a in the vicinity of a connecting portion with the refrigerant supply path 11b. Accordingly, the refrigerant flowing through the refrigerant flow path 11a becomes a turbulent flow (for example, a swirl), and the inverter module IM can be more effectively cooled.

The bases 1A to 1D of the present embodiment are preferably integrally formed by metal additive manufacturing using a powder metal, that is, 3D print additive manufacturing. The metal additive manufacturing is a known forming technique of the related art in which a metal powder is melted by an electron beam or a fiber laser and is laminated and solidified to manufacture a metal component, and is a technique in which a metal member having a three-dimensionally complicated shape can be formed and a fine and dense 3D shape can be formed.

According to the bases 1A to 1D integrally formed by 3D print additive manufacturing using a powder metal or the like, since there is no seam, leakage of the refrigerant from the inside of the bases 1A to 1D can be reliably prevented. Further, all the bases 1A to 1D may be integrally formed by 3D print additive manufacturing using a powder metal. Accordingly, the connection and sealing treatment between the refrigerant inflow portions 12 of the bases 1A to 1D and the connection and sealing treatment between the refrigerant outflow portions 13 of the bases 1A to 1D become unnecessary, and leakage of the refrigerant from the connection portions can be reliably prevented.

Although various embodiments have been described above with reference to the drawings, it is needless to say that the present invention is not limited to these examples. It is apparent that those skilled in the art can conceive of various modifications and changes within the scope described in the claims, and it is understood that such modifications and changes naturally fall within the technical scope of the present invention. In addition, respective constituent elements in the above embodiment may be freely combined without departing from the gist of the invention.

In the present specification, at least the following matters are described. Note that the corresponding constituent elements and the like in the above embodiment are shown in parentheses, but the present invention is not limited thereto.

(1) A water jacket (WJ) for cooling a plate-shaped heat generating component (inverter module IM), the water jacket including
    a base (bases 1A to 1D) having a thin plate shape,
    in which the base includes:
        a refrigerant inflow portion (refrigerant inflow portion 12) configured to allow a refrigerant to flow thereinto;
        a refrigerant flow path (refrigerant flow path 11) that communicates with the refrigerant inflow portion and is branched inside the base; and
        a refrigerant outflow portion (a refrigerant outflow portion 13) that communicates with the refrigerant flow path and is configured to allow the refrigerant to flow out therethrough.

According to (1), a portion where leakage of the flowing refrigerant may occur even when an external force is applied to the water jacket is only the connection portion between the refrigerant inflow portions and the connection portion between the refrigerant outflow portions, and leakage of the refrigerant can be prevented by sealing the connection portion between the refrigerant inflow portions and the connection portion between the refrigerant outflow portions. As a result, the water jacket can be made compact and high in quality.

(2) The water jacket according to (1),
in which the water jacket includes a plurality of the bases stacked,
in which the plate-shaped heat generating component is disposed between two of the plurality of bases, and
in which the refrigerant inflow portions of the plurality of bases are in same positions on planes orthogonal to a stacking direction, and the refrigerant outflow portions of the plurality of bases are in same positions on the planes.

According to (2), since the bases are provided on both surfaces of the plate-shaped heat generating component, the plate-shaped heat generating component can be appropriately cooled from both sides. In addition, since the refrigerant inflow portions and the refrigerant outflow portions of the plurality of bases are aggregated, the sealing treatment is facilitated in addition to compactness.

(3) The water jacket according to (1) or (2),
in which the refrigerant flow path includes a plurality of refrigerant flow paths (refrigerant flow paths 11a) arranged in parallel.

According to (3), since a rib along the refrigerant flow path is formed between the refrigerant flow paths adjacent to each other and arranged in parallel, deformation of the base can be prevented even when an external force is applied to the water jacket.

(4) The water jacket according to (3),
in which the base includes:
a refrigerant supply path (refrigerant supply path 11b) that communicates with the refrigerant inflow portion; and
a refrigerant discharge path (refrigerant discharge path 11c) that communicates with the refrigerant outflow portion, and
in which each of the refrigerant flow paths communicates with both of the refrigerant supply path and the refrigerant discharge path.

According to (4), a variation in temperature can be prevented as compared with a case where the refrigerant flow paths are connected in series.

(5) The water jacket according to (3) or (4),
in which the refrigerant flow path includes a turbulent flow generation portion (turbulent flow generation portion 11d) that generates a turbulent flow.

According to (5), the refrigerant flowing through the refrigerant flow path becomes a turbulent flow, and the plate-shaped heat generating component can be more effectively cooled.

(6) The water jacket according to any one of (3) to (5),
in which the base has a substantially rectangular shape, and
in which the plurality of refrigerant flow paths are arranged at predetermined intervals in a longitudinal direction of the base and extend in a transverse direction of the base.

According to (6), it is possible to appropriately prevent a temperature gradient and the variation in temperature that is likely to occur in the longitudinal direction of the base.

(7) The water jacket according to any one of (1) to (6),
in which the water jacket includes a plurality of the bases stacked,
the plate-shaped heat generating component is disposed between ever two of the plurality of bases, and
in which one of the plurality of bases located on one end side in a stacking direction and another of the plurality of bases located on another end side in the stacking direction are pressurized in directions approaching each other.

According to (7), since the base and the plate-shaped heat generating component are brought into close contact with each other, it is possible to appropriately cool the plate-shaped heat generating component.

(8) The water jacket according to any one of (1) to (7), in which the base is formed as one piece by 3D print additive manufacturing using powder.

According to (8), since each base is integrally formed by 3D print additive manufacturing, there is no seam. Therefore, leakage of the refrigerant from the inside of the base can be reliably prevented.

What is claimed is:
1. A water jacket for cooling a plate-shaped heat generating component, the water jacket comprising:
a unit frame; and
a base having a thin plate shape,
wherein the base includes:
a refrigerant inflow portion configured to allow a refrigerant to flow thereinto;
a refrigerant flow path that communicates with the refrigerant inflow portion and is branched inside the base; and
a refrigerant outflow portion that communicates with the refrigerant flow path and is configured to allow the refrigerant to flow out therethrough,
the refrigerant flow path includes a plurality of refrigerant flow paths arranged in parallel, and
each refrigerant flow path of the plurality of refrigerant flow paths has a circular-shape in a cross section orthogonal to a direction along the refrigerant flow path,
wherein the water jacket comprises a plurality of the bases stacked,
wherein the plate-shaped heat generating component is disposed between every two of the plurality of bases,
wherein one of the plurality of bases located on one end side in a stacking direction and another of the plurality of bases located on another end side in the stacking direction are pressurized in directions approaching each other,
wherein the unit frame pressurizes the stacked plurality of the bases in the stacking direction, and
wherein the unit frame includes:
a first fixing frame and a second fixing frame;
a plurality of coupling shafts coupling the first fixing frame and the second fixing frame;
a movable frame movable along the plurality of coupling shafts, the movable frame being accommodating the stacked plurality of the bases between the movable frame and the first fixing frame; and
a biasing member disposed between the second fixing frame and the movable frame and configured to bias the movable frame toward the first fixing frame.

2. The water jacket according to claim 1,
wherein the refrigerant inflow portions of the plurality of bases are in same positions on planes orthogonal to a stacking direction, and the refrigerant outflow portions of the plurality of bases are in same positions on the planes.

3. The water jacket according to claim 1,
wherein the base includes:

a refrigerant supply path that communicates with the refrigerant inflow portion; and a refrigerant discharge path that communicates with the refrigerant outflow portion, and wherein each of the refrigerant flow paths communicates with both of the refrigerant supply path and the refrigerant discharge path.

4. The water jacket according to claim 1, wherein the refrigerant flow path includes a turbulent flow generation portion that generates a turbulent flow.

5. The water jacket according to claim 1, wherein the base has a substantially rectangular shape, and wherein the plurality of refrigerant flow paths are arranged at predetermined intervals in a longitudinal direction of the base and extend in a transverse direction of the base.

6. The water jacket according to claim 1, wherein the base is formed as one piece by 3D print additive manufacturing using powder.

7. The water jacket according to claim 1, a rib along the refrigerant flow path is formed between refrigerant flow paths adjacent to each other of the plurality of refrigerant flow paths.

* * * * *